US008362604B2

(12) United States Patent
Ionescu

(10) Patent No.: US 8,362,604 B2
(45) Date of Patent: Jan. 29, 2013

(54) FERROELECTRIC TUNNEL FET SWITCH AND MEMORY

(75) Inventor: Mihai Adrian Ionescu, Ecublens (CH)

(73) Assignee: Ecole Polytechnique Federale de Lausanne (EPFL), Lausanne (CH)

( * ) Notice: Subject to any disclaimer, the term of this patent is extended or adjusted under 35 U.S.C. 154(b) by 537 days.

(21) Appl. No.: 12/631,052

(22) Filed: Dec. 4, 2009

(65) Prior Publication Data

US 2010/0140589 A1   Jun. 10, 2010

Related U.S. Application Data

(60) Provisional application No. 61/119,734, filed on Dec. 4, 2008.

(51) Int. Cl.
 *H01L 21/60* (2006.01)
(52) U.S. Cl. . 257/690; 257/737; 257/778; 257/E21.506; 257/E23.023; 257/704
(58) Field of Classification Search ............ 257/24, 257/295, 288, 656, E29.068, E29.255
See application file for complete search history.

(56) References Cited

U.S. PATENT DOCUMENTS

| 6,128,212 | A  | * | 10/2000 | Nakamura et al. | 365/145 |
|---|---|---|---|---|---|
| 6,163,458 | A  | * | 12/2000 | Li | 361/704 |
| 6,515,355 | B1 | * | 2/2003 | Yin et al. | 257/678 |
| 7,462,936 | B2 | * | 12/2008 | Haba et al. | 257/737 |
| 7,816,251 | B2 | * | 10/2010 | Haba et al. | 438/613 |
| 2009/0026553 | A1 | | 1/2009 | Bhuwalka et al. | |

FOREIGN PATENT DOCUMENTS

WO   WO 2008/082044   7/2008

OTHER PUBLICATIONS

Gopalakrishnan, K., et al, *IEDM* 2002, Tech Digest (2002), pp. 289-292, "I-MOS: A Novel Semiconductor Device with a Subthreshold Slope lower than kT/q."
Appenzeller, J., et al, *Physical Review Letters*, vol. 93, No. 19, pp. 196805-1-196805-4, Nov. 4, 2004; "Band-to-Band Tunneling in Carbon Nanotube Field-Effect Transistors."
Choi, W.Y., et al, *IEEE Electron Device Letters*, vol. 28, No. 8, Aug. 2007, pp. 743-745, "Tunneling Field-Effect Transistors TFETs With Subthreshold Swing (SS) Less Than 60 mV/dec."
Boucart, K., et al, *IEEE Transactions on Electron Devices*, vol. 54, No. 7, pp. 1725-2007, Jul. 2007, "Double-Gate Tunnel FET With High-k Gate Dielectric."
Abele, N., et al, Digest of International Electron Devices Meeting, IEDM, 2005, pp. 479-481; "Suspended-Gate MOSFET: bringing new MEMS functionality into solid-state MOS transistor."
Chen, F., et al, IEEE/ACM International Conference on Computer-Aided Design, 2008, ICCAD 2008, pp. 750-757, "Integrated Circuit Design with NEM Relays."
Salahuddin, S., et al, *Nano Letters*, vol. 8, No. 2, pp. 405-410, 2008, "Use of Negative Capacitance to Provide Voltage Amplification for Low Power Nanoscale Devices." Salvatore, G.A., et al, "Demonstration of Subthrehold Swing Smaller Than 60m V/decade in Fe-FET with P(VDF-TrFE)/SiO₂ Gate Stack," to appear, IEDM 2008.
Arimoto, Y., et al, MRS Bulletin 29, Nov. 2004, p. 823-828.

* cited by examiner

*Primary Examiner* — Roy Potter
(74) *Attorney, Agent, or Firm* — Nixon & Vanderhye P.C.

(57) ABSTRACT

A Ferroelectric tunnel FET switch as ultra-steep (abrupt) switch with subthreshold swing better than the MOSFET limit of 60 mV/decade at room temperature combining two key principles: ferroelectric gate stack and band-to-band tunneling in gated p-i-n junction, wherein the ferroelectric material included in the gate stack creates, due to dipole polarization with increasing gate voltage, a positive feedback in the capacitive coupling that controls the band-to-band (BTB) tunneling at the source junction of a silicon p-i-n reversed bias structure, wherein the combined effect of BTB tunneling and ferroelectric negative capacitance offers more abrupt off-on and on-off transitions in the present proposed Ferroelectric tunnel FET than for any reported tunnel FET or any reported ferroelectric FET.

12 Claims, 2 Drawing Sheets

(a) (b)

FERROELECTRIC TUNNEL FET SWITCH AND MEMORY

This application claims the benefit to U.S. Provisional Application No. 61/119,734 filed Dec. 4, 2008, the entire contents of which is hereby incorporated by reference.

TECHNICAL FIELD

The present invention concerns the field of tunneling FET (field effect transistors) switches and memory devices. More specifically, the present invention concerns an improved device that is able to offer more abrupt off-on and on-off transitions than any reported tunnel FET or any reported ferroelectric FET of the prior art. The proposed device is capable to offer lower voltage operation compared to traditional FETs of tunnel FETs by combining two switching mechanisms (band-to-band tunneling and negative capacitance) in a single device: a tunnel FET with a ferroelectric gate stack. Moreover, the proposed device can serve as a one transistor memory cell with the Ioff current much lower that any existing one transistor ferroelectric FET.

BACKGROUND OF THE INVENTION

Today power dissipation in switching devices is considered as the most important roadblock for future nanoelectronic circuits and systems. Among the power components the sub-threshold power becomes dominant in aggressively scaled MOS transistors and limits their voltage scaling. The sub-threshold swing, SS, of the gate switch-on characteristics of a field effect transistor (FET) limits the switching range, and thus the minimum supply voltage in advanced CMOS devices and their ultimate power dissipation. In conventional FETs, SS is limited to 60 mV/decade at room temperature.

In order to obtain a value of SS lower than 60 mV/decade at room temperature different principles have been proposed to date:
(1) impact ionization MOS devices (IMOS) see reference [1],
(2) tunnel FET devices (TFET) see references [2, 3, 4],
(3) micro-electro-mechanical (MEM) devices see references [5 6] and
(4) negative capacitance FET (NEG-FET) see references [7, 8].

Any of these devices is exploiting a single and unique principle for obtaining the steep transition between the off and on state:
(1) impact ionization in IMOS,
(2) band-to-band tunneling in TFET,
(3) pull-in event in MEM switches and
(4) the exploitation of negative capacitance in ferroelectrics integrated in the gate stack of Field Effect Transistor.

SUMMARY OF THE INVENTION

This invention refers to a new device, the ferroelectric Tunnel FET that exploits two physics principles in a single device architecture to obtain a very steep transition from off to on state compare to any existing solid state device reported to date that exploits just a single switching principle.

Moreover, the resulting device could present a hysteretic abrupt characteristic due to the ferroelectric gate stack combined with the lowest off current, Ioff, as explained in the summary of the invention, which is benefic for memory applications. It is known that ferroelectric random access memory (FeRAM) is one of the promising non-volatile memories, because of its low power consumption and operation speed comparable to that of dynamic RAM (DRAM) see reference [9]. The success of commercially available FeRAM chips based on one transistor and one capacitor memory cells (1T-1C) is limited by the scaling of the capacitor, therefore one-transistor-type (1T-type) FeRAM has a potential to overcome this problem, because each memory cell in 1T-type FeRAM is composed of a single ferroelectric-gate FET (field effect transistor). However, the voltage scaling in Fe-FETs and their Ioff currents are limited by silicon part of the device, which is a field effect transistor.

The proposed invention offers a promising alternative form low power low voltage to ferroelectric memory cells by replacing the underneath FET transistor with a tunnel FET transistor, which integrates a ferroelectric gate stack. The resulting hysteretic tunnel FET becomes a unique low power memory candidate, as explained in details in the summary of the invention.

An example of pure tunnel FET device has been proposed in reference [10], incorporated by reference in its entirety in the present application, which proposes that use of low energy band-gap layers in a tunnel FET architecture; however, the gate stack has no other functionality, in contrast with other proposal, than coupling the field into the tunneling junction. The main claims of this reference refer to the method of making the tunnel FET with improved switching properties based on the improved band-to-band tunneling uniquely.

An example of pure ferroelectric FET is the memory device proposed in reference [11], incorporated by reference in its entirety in the present application, which describes a metal-ferroelectric-metal-semiconductor (MFMS) on a FET channel device, without any possibility of reducing the Ioff currents or making the conduction more abrupt than the one in a MOSFET. The main claims in patent reference [11] refer to the memory properties added on top of the MOSFET operation.

The present invention accordingly relates to a Ferroelectric Tunnel FET (Fe Tunnel FET) device that combines two abrupt switches principles:
(i) positive feedback in the gate stack and
(ii) band-to-band tunneling in a gated p-i-n junction,
in order to obtain an extremely abrupt switching and an ultra-low Ioff current.

From a theoretical point of view, the present invention proposes a device architecture able to reduce the subthreshold swing (the voltage required to increase or reduce $I_D$ by one decade) of a switch by the simultaneous combined lowering of the two physical terms, m and n, as described in the equation below:

$$SS = \frac{\partial V_g}{\partial (\log I_d)} = \underbrace{\frac{\partial V_g}{\partial \psi_s}}_{m} \underbrace{\frac{\partial \psi_s}{\partial (\log I_D)}}_{n}$$

where $V_g$ is the gate voltage, $\psi s$ is the surface potential and $I_D$ the drain current of any field effect controlled transistor switch. Particularly, in the Ferroelectric Tunnel FET of the present invention, the m term is reduced by the action of the ferroelectric material and the n term by the action of the tunneling. It is worth noting that a physical coupling between m and n could furthermore enhance the reduction of SS, if the reduction of m and n are achieved in a single device architecture. This is possible in a tunnel FET with ferroelectric gate stacks that fulfills the conditions for achieving a negative capacitance (e.g. ferroelectric layer can introduce a positive feedback on the charge).

The resulting switch has extremely low voltage and low power operations, much lower than any of the present state-of-the-art switches that use only a single abrupt switching principles: for impact ionization see reference [1]; for band-to-band tunneling see references [2, 3, 4], for the negative capacitance FET using ferroelectrics see reference [7, 8] or a movable gate or movable body micro-electro-mechanical devices see references [5, 6]. Additionally, by controlling the width of the hysteretic current-voltage curve, the proposed switch according to the present invention can serve both switching and non-volatile memory applications.

DETAILED DESCRIPTION OF THE INVENTION

Figure 1:
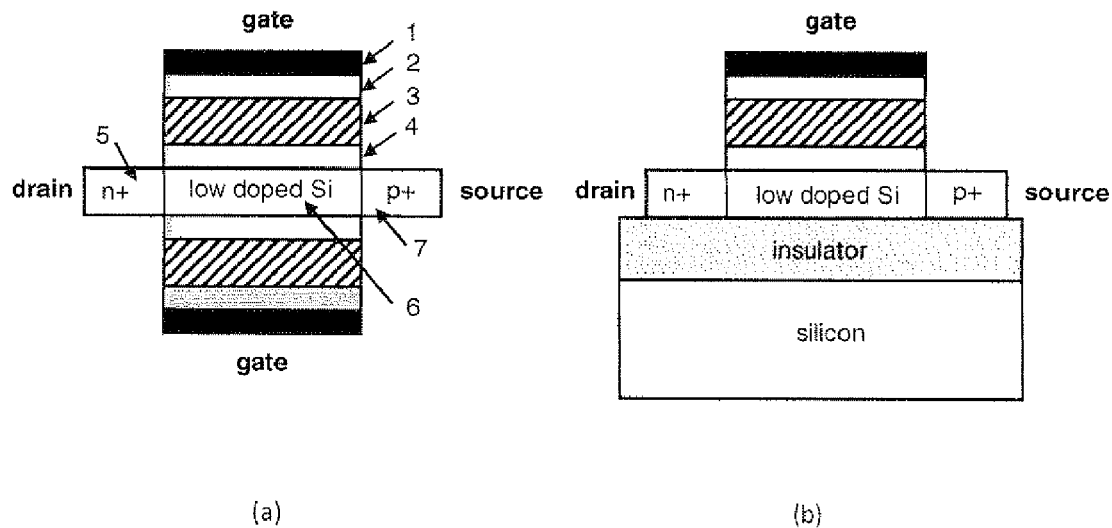
FIG. 1 shows a cross section of a ferroelectric Tunnel FET structure according to the present invention; (a) corresponding to a double-gate ferroelectric tunnel FET or a gate all-around ferroelectric tunnel FET that is achievable in wrapped gate nanowires and (b) a single-gate ferroelectric tunnel FET, with gate stack on the top that is achievable in Silicon-On-Insulator on bulk silicon. For the described operation the top and bottom gates are connected together (however, a double gate structure with independent operation of top and bottom gates can be also imagined).

Ferroelectric n-type tunnel FET embodiments according to the present invention are illustrated in FIGS. 1 (a) and (b). They comprise a tunnel FET based on a gated pin junction and ferroelectric gate stack that controls the tunneling process. The structure could correspond to a double-gate Silicon-On-Insulator or a Gate-All-Around Nanowire FET, depicted by the cross-section of FIG. 1a. The layers involved are at least: a metal or polysilicon gate 1, a dielectric capping layer 2, a ferroelectric material 3, a thin interfacial dielectric (could be silicon dioxide) 4, a highly n-type doped silicon 5, a low doped (or intrinsic) silicon 6 and a highly p-type doped silicon 7.

Layers 2 (dielectric capping) and 4 (thin interfacial dielectric) are not mandatory for the device operation and may be absent. Layers 5, 6 and 7 may be any other equivalent type of semiconductor and the materials that may be used are not limited to the examples given above.

FIG. 1b shows a similar implementation with single top gate on Silicon-On-Insulator; the similar device can be obtained on bulk silicon.

In the device sub-threshold region (gate voltage smaller than the threshold voltage) both a highly non-linear band-to-band tunneling current dependence on the gate voltage and a positive feedback in the gate ferroelectric material, resulting in a negative capacitance and, consequently inducing a very abrupt switching, are originally combined.

The proposed switch has some unique figures of merit because of the reversed biased tunnel FET pin structures, keeps the Ioff current orders of magnitude lower that in the ferroelectric FET switch proposed by Sallahudin in reference [7], incorporated by reference in entirety in the present application. Moreover, the transition is even more abrupt than in a normal tunnel FET because of the supplementary positive feedback coming from the ferroelectric gate stack. The ferroelectric is also behaving as high-k dielectric, which further improves the tunneling current by the stronger capacitive coupling of the gate bias and tunneling junction, as demonstrated in reference [4] which is incorporated by reference in entirety in the present application.

Figure 2:
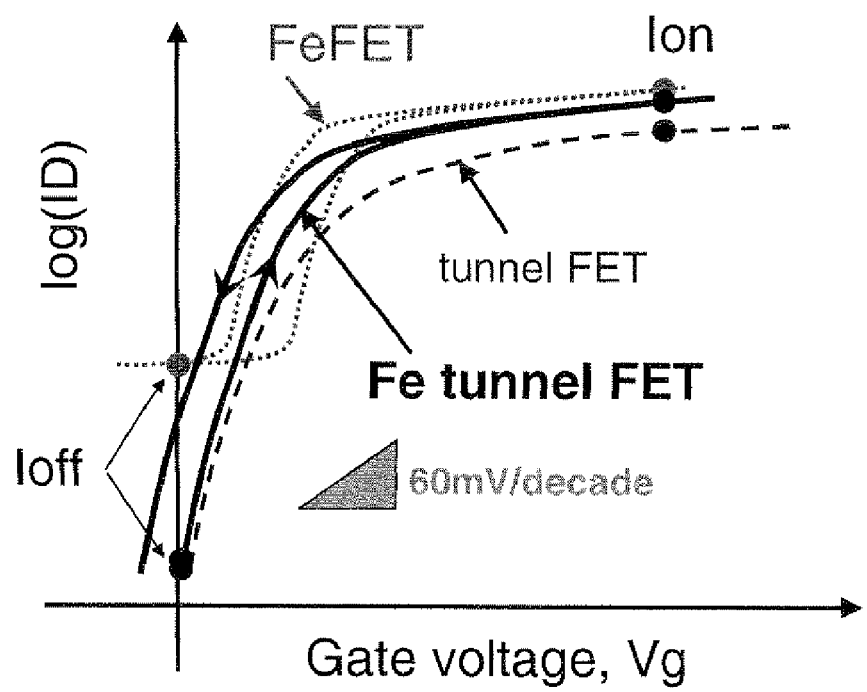
FIG. 2 shows the qualitative drain current versus gate voltage characteristics of a ferroelectric tunnel FET (Fe Tunnel FET) according to the present invention compared with a conventional tunnel FET and a conventional ferroelectric FET (FeFET) and FIG. 3 illustrates a hysteretic operation: drain current versus gate voltage characteristics of a ferroelectric tunnel FET (Fe Tunnel FET) 1 T non-volatile memory according to the present invention.

It is then expected, as shown in FIG. 2, that the transition between the off and the on states will happen with a swing (dVg/dlog(Id)) which is much better than the one previously reported for tunnel FETs or ferroelectrics FETs separately, and such a very small swing (certainly much smaller than 10-20 mV/decade at room temperature) will apply on much more decades of current than in recently reported tunnel FETs see reference [3] and FeFETs see reference [8], both incorporated by reference in entirety in the present application.

More specifically, FIG. 2 illustrates the qualitative drain current versus gate voltage characteristics of a ferroelectric tunnel FET (Fe Tunnel FET) compared with conventional tunnel FET and ferroelectric FET (FeFET). The proposed device principle enables an Ioff current as low as in Tunnel FETs with a much abrupt transitions between off and on states than any of the other two devices. Due to the high-k nature of the ferroelectric, the Ion current on Tunnel FeFET is higher than in conventional Tunnel FET. Arrows on Fe tunnel FET curve indicate the hysteresis cycle of the FET according to the present invention.

Another great advantage of a proposed one transistor (1T) architecture according to the present invention is the associated hysteresis and polarization in ferroelectric gate that is proposed to serve for a tunnel FET non-volatile memory cell with probably the lowest possible Ioff consumption. Recent reports show that in thin layer ferroelectric materials one can control the hysteresis within a window of few Volts, which can be scaled further with the ferroelectric thickness. As a consequence, the ferroelectric tunnel FET according to the present invention can offer an excellent solution for a 1 transistor memory cell with scaled voltage and extremely low power.

Figure 3:
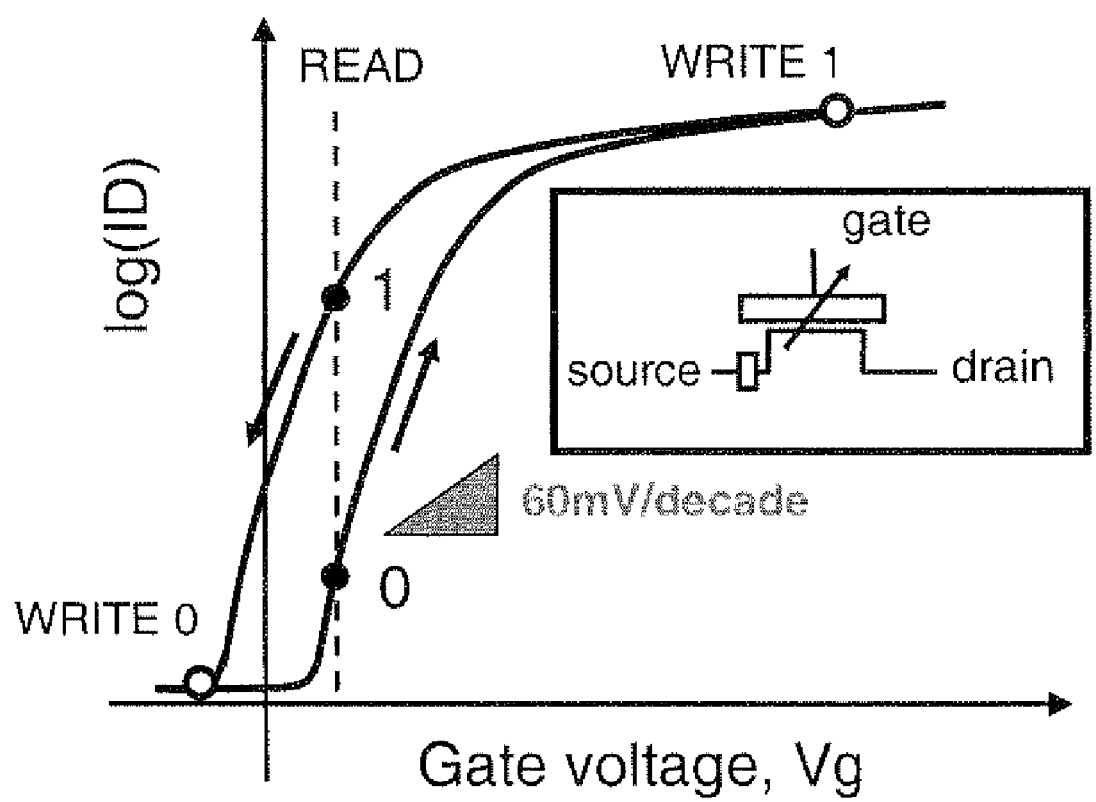

FIG. 3 depicts the operation of a 1T memory cell based on a tunnel FET device as a non-volatile memory cell (the memory device embodiment is similar to the one proposed in FIG. 1 but the choice of the ferroelectric layer and voltages is made such as the hysteretic behavior is accentuated). A hysteretic operation can be achieved in the drain current versus gate voltage characteristics of ferroelectric tunnel FET (Fe Tunnel FET), resulting in a one transistor (1 T) non-volatile memory. The programming of the memory cell is achieved by the voltage applied on the gate (high gate voltage for WRITE '1' and low gate voltage for WRITE '0'), The read out is performed at intermediate values of the gate voltage, as suggested by FIG. 3, where the low and high values of the drain current are distinguishable due to shift induced by the polarization. The inset of FIG. 3 shows the symbol of the respective device suggesting a bias dependent gate capacitance with a tunneling junction at the source. It is worth noting that the non-volatility of the memory cell is provided very similarly to a ferroelectric capacitor, by the remnant polarization of the ferroelectric stack after programming the memory cell.

Overall, the proposed ferroelectric tunnel FET switch and memory according to the present invention will have improved electrical characteristics compared to any existing switch devices: a much lower Ioff than conventional MOSFET and FeFET switches, better Ion than conventional tunnel FETs and much better subthreshold swings than any MOSFET or tunnel FET. The proposed ferroelectric tunnel FET according to the present invention can be realized on advanced bulk silicon platforms or on Silicon-On-Insulator, as double-gate, FIN-FET and multiple gate devices as well as a nanowire devices; in general, the ferroelectric tunnel FET architecture is implementable on any type of semiconductor substrate on which a gated junction can be realized.

Applications of the proposed device architectures include but are not limited to ultra-low power standby logic, power gating switches, non-volatile and volatile memories, Radiofrequency low power devices for wireless sensor networks and RFID tags.

For example, one may consider a Ferroelectric Tunnel FET one transistor (1T) memory based on the hysteretic behavior generated by ferroelectric material, the ultra-low Ioff offered by the reversed biased silicon p-i-n junction and the abrupt off-on and on-off transitions.

In an embodiment, one may also envisage using other materials than ferroelectrics in the gate stack such as materials offering polaronic effects or bias dependent dielectric permittivity, able to provide a positive feedback in the gate stack or negative gate capacitance for tunnel FET based on gated pin junction.

In an embodiment, the device may use a ferroelectric gate stack on other than silicon semiconductor materials or heterostructures for the implementation of the tunneling junction.

As further application, one may envisage double-gate, multi-gate, FIN-FET, Silicon-On-insulator MOSFET and wrapped-gate nanowire technological implementations of the ferroelectric tunnel FET and ferroelectric tunnel memory defined in the present invention.

In an embodiment, the device comprises a unipolar or ambipolar ferroelectric carbon nanotube tunnel FET comprising a carbon nanotube tunneling device with ferroelectric gate stack and band-to-band tunneling mechanism according to the present invention.

More generally, the present invention covers any semiconductor device based on a gated junction or field effect transistor effect that combines very steep switching the band-to-band tunneling and the positive feedback or negative capacitance associated with a ferroelectric gate stack.

REFERENCES

[1] K. Gopalakrishnan, P. B. Griffin and J. D. Plummer, I-MOS: a novel semiconductor device with a subthreshold slope lower than kt/q, IEDM 2002, Tech Digest (2002), pp. 289-292.
[2] J. Appenzeller, Y.-M. Lin, J. Knoch, and Ph. Avouris, "Band-to-Band Tunneling in Carbon Nanotube Field-Effect Transistors," *Phys. Rev. Lett.*, vol. 93, no. 19, pp. 196805-1-196805-4, November 2004.
[3] W. Y. Choi, B.-G. Park, J. D. Lee, and T.-J. K. Liu, "Tunneling Field-Effect Transistors (TFETs) With Subthreshold Swing (SS) Less Than 60 mV/dec.," *IEEE Electron Device Lett.*, vol. 28, no. 8, pp. 743-745, August 2007.
[4] K. Boucart and A. M. Ionescu, Double-gate tunnel FET with high-k gate dielectric, IEEE Trans Electron Dev 54 (7), pp. 1725-1733, 2007.
[5] N. Abele, R. Fritschi, K. Boucart, F. Casset, P. Ancey, and A. M. Ionescu, "Suspended-gate MOSFET: bringing new MEMS functionality into solid-state MOS transistor," in Digest of International Electron Devices Meeting, IEDM, 2005, pp. 479-481.
[6] F. Chen; H Kam; D. Markovic, T.-J. King Liu, V. Stojanovic, E. Alon, IEEE/ACM International Conference on Computer-Aided Design, 2008, ICCAD 2008, pp. 750-757.
[7] S. Salahuddin, S. Datta, "Use of Negative Capacitance to Provide Voltage Amplification for Low Power Nanoscale Devices," *Nano Letters, Vol.* 8, No. 2, pp. 405-410, 2008.
[8] G. Salvatore, D. Bouvet, A. M. Ionescu, "Demonstration of Subthrehold Swing Smaller Than 60 mV/decade in Fe-FET with P(VDF-TrFE)/SiO2 Gate Stack", to appear, IEDM 2008.
[9] Y. Arimoto, H. Ishiwara, MRS Bull. 29, 2004, p. 823.
[10] K. K. Bhuwalka, K. Goto, Tunnel field-effect transistor with narrow band-gap channel and strong gate coupling, USPTO Application #: 2009/0026553.
[11] PARK, Byung-Eun, FET, FERROELECTRIC MEMORY DEVICE, AND METHODS OF MANUFACTURING THE SAME, International Application No.: PCT/KR2007/002882, Jun. 14, 2007.

The invention claimed is:

1. A ferroelectric tunnel FET comprising a ferroelectric gate stack and a band-to-band tunneling in gated p-i-n junction, wherein the ferroelectric material included in the gate stack creates, due to dipole polarization with increasing gate voltage, a positive feedback in the capacitive coupling that controls the band-to-band (BTB) tunneling at the source junction of a silicon p-i-n reversed bias structure, such that the combined effect of band-to-band tunneling and ferroelectric negative capacitance offers more abrupt off-on and on-off transitions than for any reported tunnel FET or any reported ferroelectric FET.

2. A ferroelectric tunnel FET as defined in claim 1, comprising at least a gate of metal or polysilicon, a ferroelectric material, a highly n-type doped silicon, a low doped or intrinsic silicon and a highly p-type doped silicon.

3. A ferroelectric tunnel FET as defined in claim 2, comprising a dielectric capping on the ferroelectric material.

4. A ferroelectric tunnel FET as defined in claim 2, comprising a thin interfacial dielectric between the ferroelectric material and the low-doped or intrinsic silicon.

5. A ferroelectric tunnel FET as defined in claim 4, wherein the thin interfacial dielectric is made of silicon dioxide.

6. A ferroelectric Tunnel FET one transistor (1T) memory based on the hysteretic behavior generated by ferroelectric material, the ultra-low Ioff offered by the reversed biased silicon p-i-n junction and the abrupt off-on and on-off transitions.

7. A ferroelectric tunnel FET as defined in claim 1 using other materials than ferroelectrics in said gate stack able to provide a positive feedback in the gate stack or negative gate capacitance for tunnel FET based on gated pin junction.

8. A ferroelectric tunnel FET as defined in claim 7, wherein said other materials are materials offering polaronic effects or bias dependent dielectric permittivity.

9. A tunneling device as defined in claim 1 wherein the ferroelectric gate stack is on other than silicon semiconductor materials or heterostructures for the implementation of the tunneling junction.

10. A Double-gate, or multi-gate, or FIN-FET, or Silicon-On-insulator MOSFET or wrapped-gate nanowire technological implementations using the ferroelectric tunnel FET defined in claim 1.

11. A unipolar or ambipolar ferroelectric carbon nanotube tunnel FET comprising a carbon nanotube tunneling device with ferroelectric gate stack and band-to-band tunneling mechanism.

12. A semiconductor device based on a gated junction that combines very steep switching the band-to-band tunneling and the positive feedback or negative capacitance associated with a ferroelectric gate stack, wherein very steep switching means showing a slope lower than 60 mV/decade at room temperature.

* * * * *